(12) United States Patent
Li (10) Patent No.: US 11,605,610 B2
(45) Date of Patent: Mar. 14, 2023

(54) DEPTH-ADAPTIVE MECHANISM FOR BALL GRID ARRAY DIPPING

(71) Applicant: Google LLC, Mountain View, CA (US)

(72) Inventor: Fan Li, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/488,797

(22) Filed: Sep. 29, 2021

(65) Prior Publication Data
US 2022/0020719 A1 Jan. 20, 2022

Related U.S. Application Data

(60) Provisional application No. 63/249,391, filed on Sep. 28, 2021.

(51) Int. Cl.
*B23K 1/00* (2006.01)
*H01L 23/00* (2006.01)
*B23K 1/20* (2006.01)

(52) U.S. Cl.
CPC ............ *H01L 24/75* (2013.01); *B23K 1/203* (2013.01); *H01L 2224/7501* (2013.01); *H01L 2924/15311* (2013.01)

(58) Field of Classification Search
CPC ............ H01L 24/75; H01L 2224/7501; H01L 2924/15311; H01L 24/13; H01L 24/16;
(Continued)

(56) References Cited

U.S. PATENT DOCUMENTS

| 5,439,162 A * | 8/1995 | George ................. H01L 24/12 257/E21.511 |
| 6,099,681 A * | 8/2000 | Arikado .............. B23K 3/0623 269/21 |

(Continued)

FOREIGN PATENT DOCUMENTS

| AT | 512859 A2 * | 11/2013 | ....... H01L 21/67144 |
| CN | 105140203 A * | 12/2015 | |

(Continued)

OTHER PUBLICATIONS

"What is the dipping technique?", Retrieved at: https://www.emsproto.com/en/quest-technique-dipping—on Aug. 2, 2021, 8 pages.

(Continued)

*Primary Examiner* — Kiley S Stoner
(74) *Attorney, Agent, or Firm* — Colby Nipper PLLC (57) ABSTRACT

This document describes systems and techniques of a depth-adaptive mechanism for ball grid array dipping. In an aspect, a depth-adaptive mechanism having a tensioned mesh is positioned in a reservoir filled with flux. When solder balls of an integrated circuit component are dipped into the reservoir of flux, the solder balls are pressed up against the tensioned mesh. The tensioned mesh is configured to, first, elastically deform under the downward force applied by the solder balls and, second, provide an equal and opposite pushing force in order to facilitate solder ball extraction. In so doing, the solder balls of an integrated circuit component can be more easily extracted from flux when deep ball grid array dipping is performed.

7 Claims, 6 Drawing Sheets

(58) Field of Classification Search
CPC ............... H01L 24/81; H01L 2224/118; H01L 2224/13111; H01L 2224/13116; H01L 2224/13139; H01L 2224/13147; H01L 2224/16227; H01L 2224/81011; H01L 2224/81815; B23K 1/203; B23K 2101/42; B23K 35/0244
USPC ............... 228/207, 223, 245–246, 33, 40–41
See application file for complete search history.

(56) References Cited

U.S. PATENT DOCUMENTS

| | | | | |
|---|---|---|---|---|
| 2005/0133573 | A1* | 6/2005 | Bayot | H05K 3/3489 228/246 |
| 2007/0172981 | A1* | 7/2007 | Wang | H01L 24/11 438/615 |
| 2012/0211547 | A1* | 8/2012 | Hsiao | B23K 1/203 228/8 |
| 2014/0048586 | A1* | 2/2014 | Jang | B23K 1/203 228/36 |
| 2019/0247944 | A1* | 8/2019 | Hsu | B23K 3/082 |
| 2019/0275600 | A1 | 9/2019 | Hsu et al. | |

FOREIGN PATENT DOCUMENTS

| | | | | |
|---|---|---|---|---|
| CN | 209363017 | | 9/2019 | |
| CN | 111739834 | A * | 10/2020 | |
| CN | 211963753 | U * | 11/2020 | |
| DE | 102004050429 | B3 * | 5/2006 | ........... B23K 1/0008 |
| JP | H07193097 | A * | 5/1995 | |
| JP | 10209208 | A * | 8/1998 | |
| JP | H10209208 | A * | 8/1998 | |
| JP | 4217074 | B2 * | 1/2009 | |
| JP | 2011143372 | A * | 7/2011 | |
| JP | 2011187682 | A * | 9/2011 | |
| WO | WO-2015038074 | A1 * | 3/2015 | ............. H01L 24/75 |

OTHER PUBLICATIONS

Chen, et al., "TI OMAP4xxx POP SMT Design Guideline", Retrieved at: https://www.ti.com/lit/an/swpa182c/swpa182c.pdf?ts=1625777002975&ref_url=https%253A%252F%252Fwww.google.com%252F—on Aug. 2, 2021, 57 pages.

Thein, "3D Assembly Processes: A Look at Today and Tomorrow", Retrieved at: https://smt.iconnect007.com/index.php/article/96046/?skin=smt&p=3, Feb. 26, 2016, 8 pages.

* cited by examiner

DEPTH-ADAPTIVE MECHANISM FOR BALL GRID ARRAY DIPPING

RELATED APPLICATION

This application claims priority under 35 U.S.C. § 119(e) to U.S. Provisional Patent Application 63/249,391, filed on Sep. 28, 2021 which is incorporated herein by reference in its entirety.

SUMMARY

This document describes systems and techniques of a depth-adaptive mechanism for ball grid array dipping. An array of solder balls, defining a ball grid array (BGA), which are physically and electrically coupled to an integrated circuit component, are dipped into a reservoir containing flux prior to reflow (e.g., melting) and mounting on an external circuit. Various depths of BGA dipping are desired depending on product specification and use. In some instances, when performing deep BGA dipping, solder balls of an integrated circuit may get stuck in the flux, introducing inefficiencies in the manufacturing process.

To resolve these inefficiencies, in an aspect, a depth-adaptive mechanism having a tensioned mesh may be positioned in a reservoir filled with flux. When solder balls of an integrated circuit are dipped into the flux and pressed up against the tensioned mesh, the tensioned mesh may be configured to elastically deform and provide an equal and opposite pushing force. In so doing, the depth-adaptive mechanism can facilitate solder ball extraction during deep BGA dipping.

This Summary is provided to introduce simplified concepts of systems and techniques of a depth-adaptive mechanism for BGA dipping, the concepts of which are further described below in the Detailed Description and Drawings. This Summary is not intended to identify essential features of the claimed subject matter, nor is it intended for use in determining the scope of the claimed subject matter.

BRIEF DESCRIPTION OF THE DRAWINGS

The details of one or more aspects of systems and techniques of a depth-adaptive mechanism for ball grid array (BGA) dipping are described in this document with reference to the following drawings.

The same numbers are used throughout the Drawings to reference like features and components.

DETAILED DESCRIPTION

Overview

This document describes systems and techniques of a depth-adaptive mechanism for ball grid array dipping. In an aspect, a depth-adaptive mechanism having a tensioned mesh is positioned in a reservoir filled with flux (e.g., solder flux, underfill flux). When solder balls of an integrated circuit component are dipped into the reservoir of flux ("BGA dipping"), one or more solder balls are pressed up against the tensioned mesh. The tensioned mesh is configured to, first, elastically deform under the downward force applied by the one or more solder balls and, second, provide an equal and opposite pushing force in order to facilitate the extraction of the solder balls.

The proliferation and miniaturization of electronic devices over the past century has been advanced by a variety of ingenious manufacturing techniques, such as ball grid array dipping. A ball grid array is a type of surface-mount packaging in which a plurality of solder balls, defining an array, are physically and electrically coupled to a surface of an integrated circuit component. The process of dipping one or more solder balls defining the ball grid array (BGA) of the integrated circuit component into a reservoir containing flux is referred to as BGA dipping. After BGA dipping, the integrated circuit component can be semi-permanently mounted to external circuitry using mounting techniques such as controlled collapse chip connection.

Due to the efficiency of BGA dipping and the subsequent reliability of the end-product, many electronic devices (e.g., smartphones, computers, cars) contain circuitry fabricated using BGA dipping as the surface-mount packaging technique. In some instances, however, at deeper dipping depths, due to the viscosity of flux, it becomes increasingly more difficult to extract the solder balls from the flux. In some instances, the solder balls may get stuck in the flux, altogether, resulting in inefficiencies during manufacturing. To boost manufacturing efficiency and end-product reliability, it is desirable to position within a reservoir a depth-adaptive mechanism having a tensioned mesh which can provide a pushing force to facilitate the extraction of solder balls from the flux.

Example Environment

Figure 1:
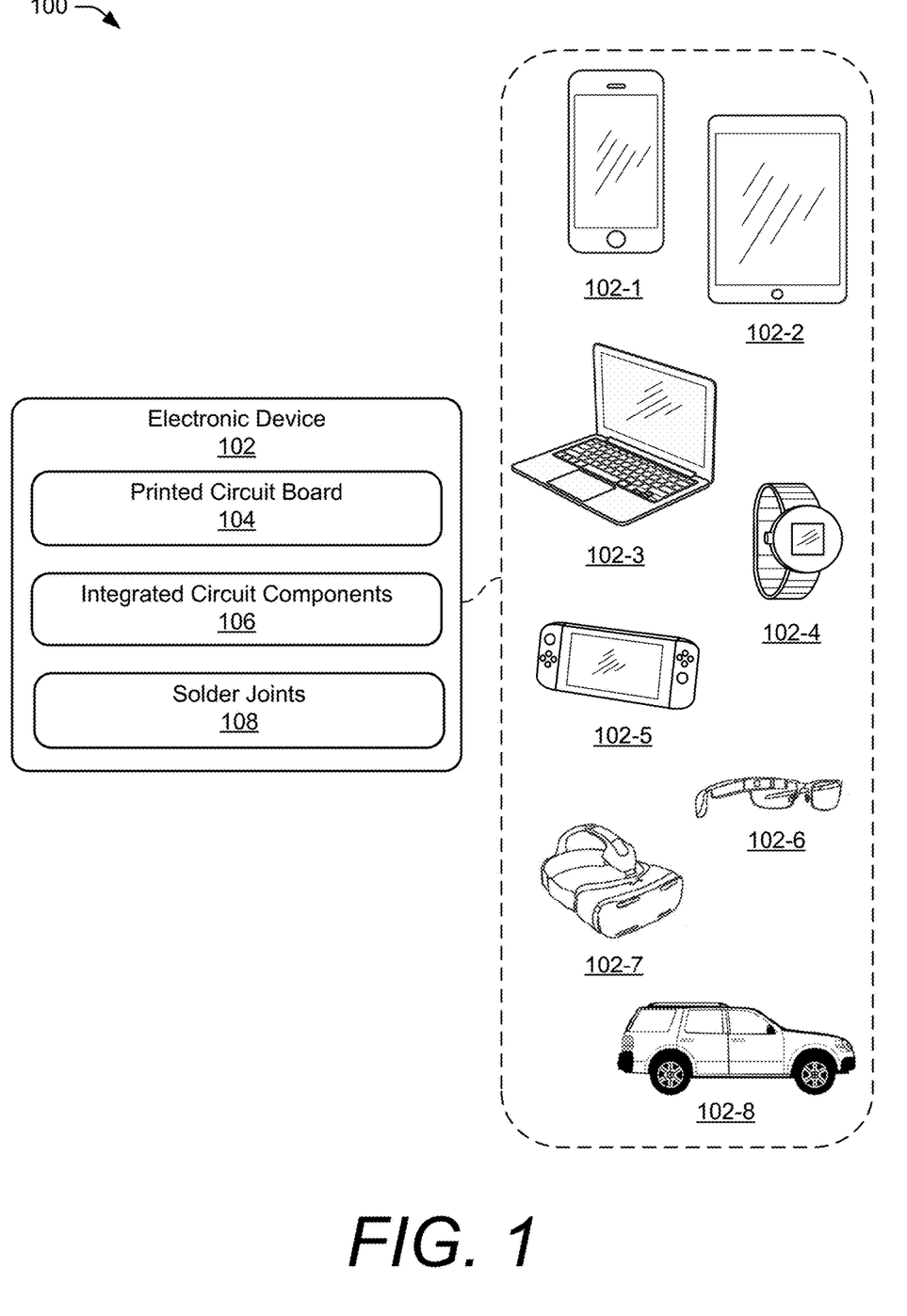
FIG. 1 illustrates an example operating environment for integrating, within an electronic device, circuitry fabricated using BGA dipping in accordance with the systems and techniques disclosed herein.

FIG. 1 illustrates an example operating environment 100 for integrating, within an electronic device 102, circuitry fabricated using BGA dipping in accordance with the systems and techniques disclosed herein. Environment 100 includes an example electronic device 102 having a printed circuit board (PCB) 104, integrated circuit components 106, and solder joints 108. The electronic device 102 may include additional components and interfaces omitted from FIG. 1 for the sake of clarity.

The electronic device 102 can be a variety of electronic devices. As non-limiting examples, the electronic device 102 can be a mobile phone 102-1, a tablet device 102-2, a laptop computer 102-3, a computerized watch 102-4, a portable video game console 102-5, smart glasses 102-6, VR goggles 102-7, and a car 102-8, though other devices may also be used, such as home automation and control systems, entertainment systems, audio systems, desktop computers, other home appliances, security systems, netbooks, and the like. Note that the electronic device 102 can be wearable, non-wearable but mobile, or relatively immobile (e.g., desktops, appliances). Note also that the electronic device 102 can be used with, or embedded within, many electronic devices 102 or peripherals, such as in automobiles or as an attachment to a laptop computer.

The solder joints 108 (e.g., fuse materials such as tin (Sn), silver (Ag), copper (Cu), lead (Pb), and so on), effectuate a coupling (e.g., a mechanical coupling and, in some instances, an electrical coupling) of an integrated circuit component 106 to the PCB 104. The PCB 104 (e.g., a motherboard, mainboard, system board, logic board) may be an external circuit holding and enabling the transmission of electrical signals between a plurality of electronic components electrically connected to the PCB 104.

The integrated circuit components 106 can be a variety of electronic components. As non-limiting examples, the integrated components can be processors, sensors, memory components, and the like. The processors may be single-core or multiple-core processors including a system on a chip (SoC), an application processor (AP), a central processing unit (CPU), and a graphics processing unit (GPU). The sensors may include a microphone, an accelerometer, a vibration sensor, a gyroscope, and a global navigation satellite system (GNSS) receiver. The memory components may include any suitable memory storage devices including long-term memory storage devices (e.g., disk space) or short-term memory storage devices like random-access memory (RAM), static RAM (SRAM), dynamic RAM (DRAM), non-volatile RAM (NVRAM), read-only memory (ROM), or flash memory to store device data of the electronic device 102, user data, and/or multimedia data.

Figure 2:
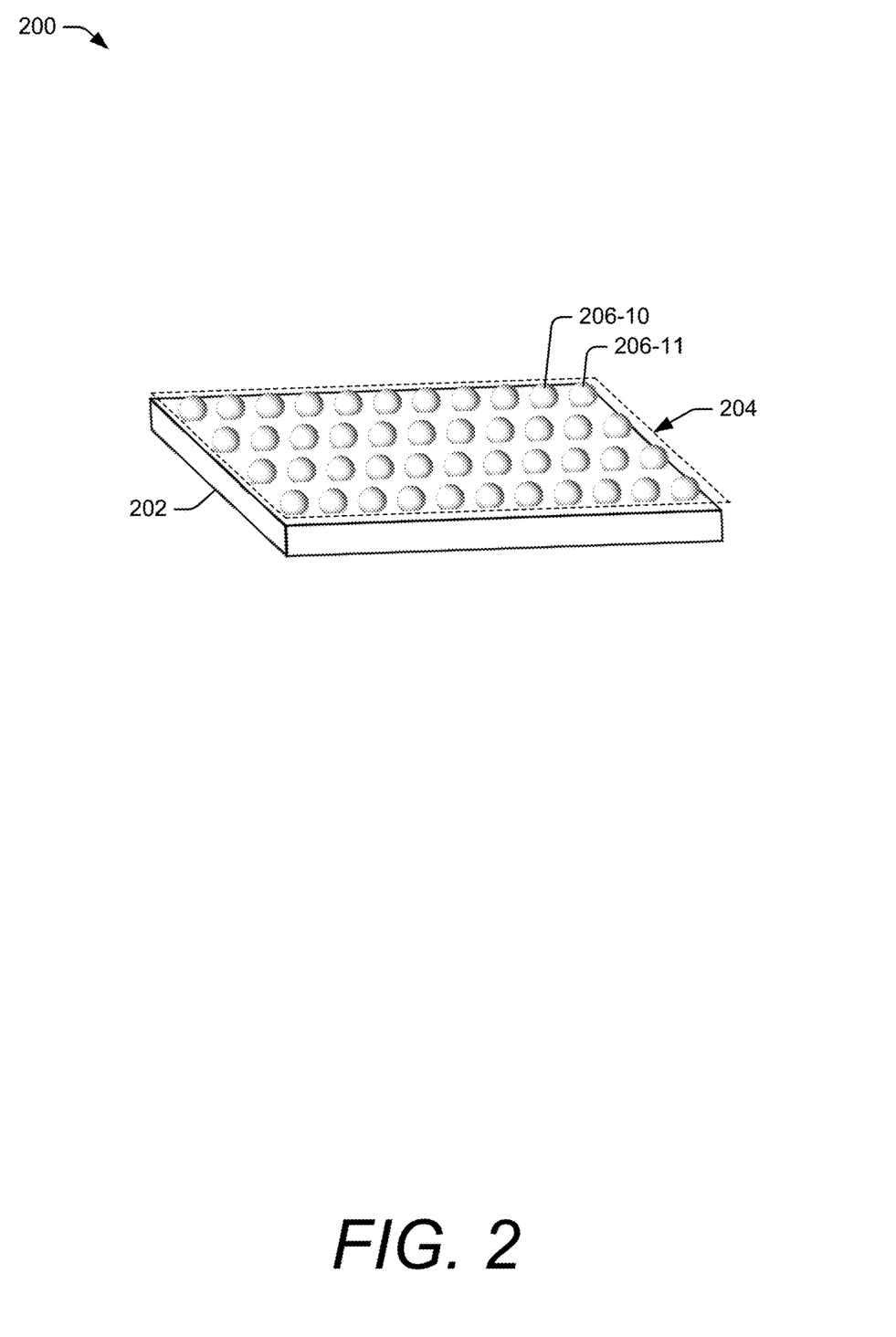
FIG. 2 illustrates an integrated circuit component having a BGA on a surface of the integrated circuit component.

FIG. 2 illustrates an integrated circuit component 202 (e.g., one of the integrated circuit components 106) having a BGA 204 on a surface of the integrated circuit component 202. The BGA 204 is an array of solder balls 206 (e.g., solder ball 206-10, solder ball 206-11) physically and electrically coupled to the integrated circuit component 202. The solder balls 206 may vary in number (e.g., 44, 200), size (e.g., 0.76 mm, 500 µm), spacing, and location on the surface of the integrated circuit component 202.

Before mounting the integrated circuit component 202 to external circuitry (e.g., PCB 104), flux may be applied to the solder balls 206 of the integrated circuit component 202. Flux may be applied to the solder balls 206 by dipping the solder balls 206, defining the BGA 204, of the integrated circuit component 202 into a reservoir of flux ("BGA dipping").

Figure 3:
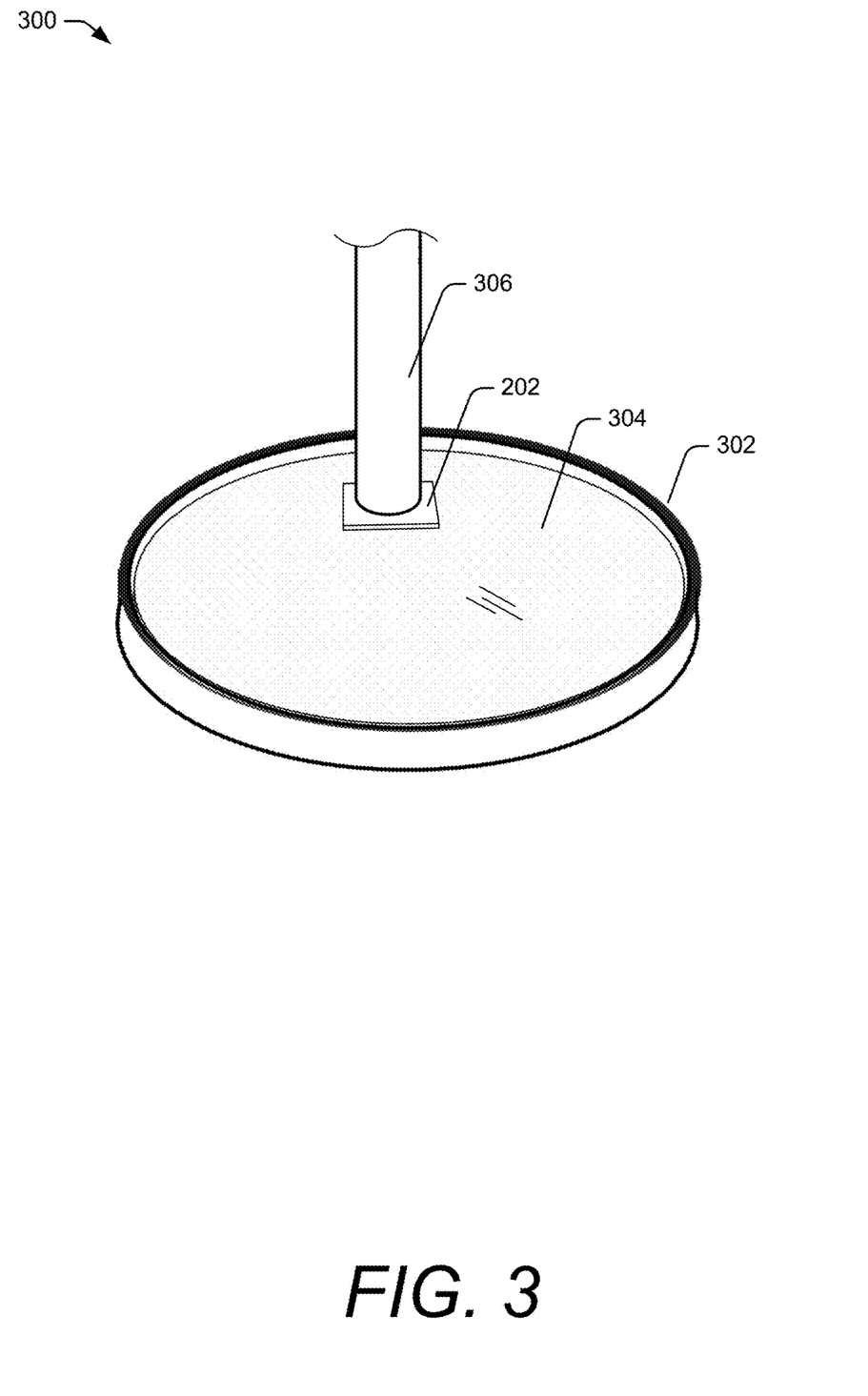
FIG. 3 illustrates an example environment depicting the integrated circuit component being held by a dipping mechanism above a reservoir filled with flux.

FIG. 3 illustrates an example environment 300 depicting the integrated circuit component 202 being held by a dipping mechanism 306 above a reservoir 302 filled with flux 304. The environment 300, including the reservoir 302 and dipping mechanism 306, may include additional components and features omitted from FIG. 3 for the sake of clarity. As illustrated, the reservoir 302 is cylindrical in shape. In other implementations, the reservoir 302 may be rectangular, oblong, or the like. The reservoir 302 is filled with flux 304. As illustrated, the dipping mechanism 306 may be a vacuum tube which holds the integrated circuit component 202 by means of a suction force. The dipping mechanism 306 may descend a predetermined distance, such that the solder balls (e.g., solder balls 106) of the integrated circuit component 202 can be immersed in flux 304.

Figure 4:
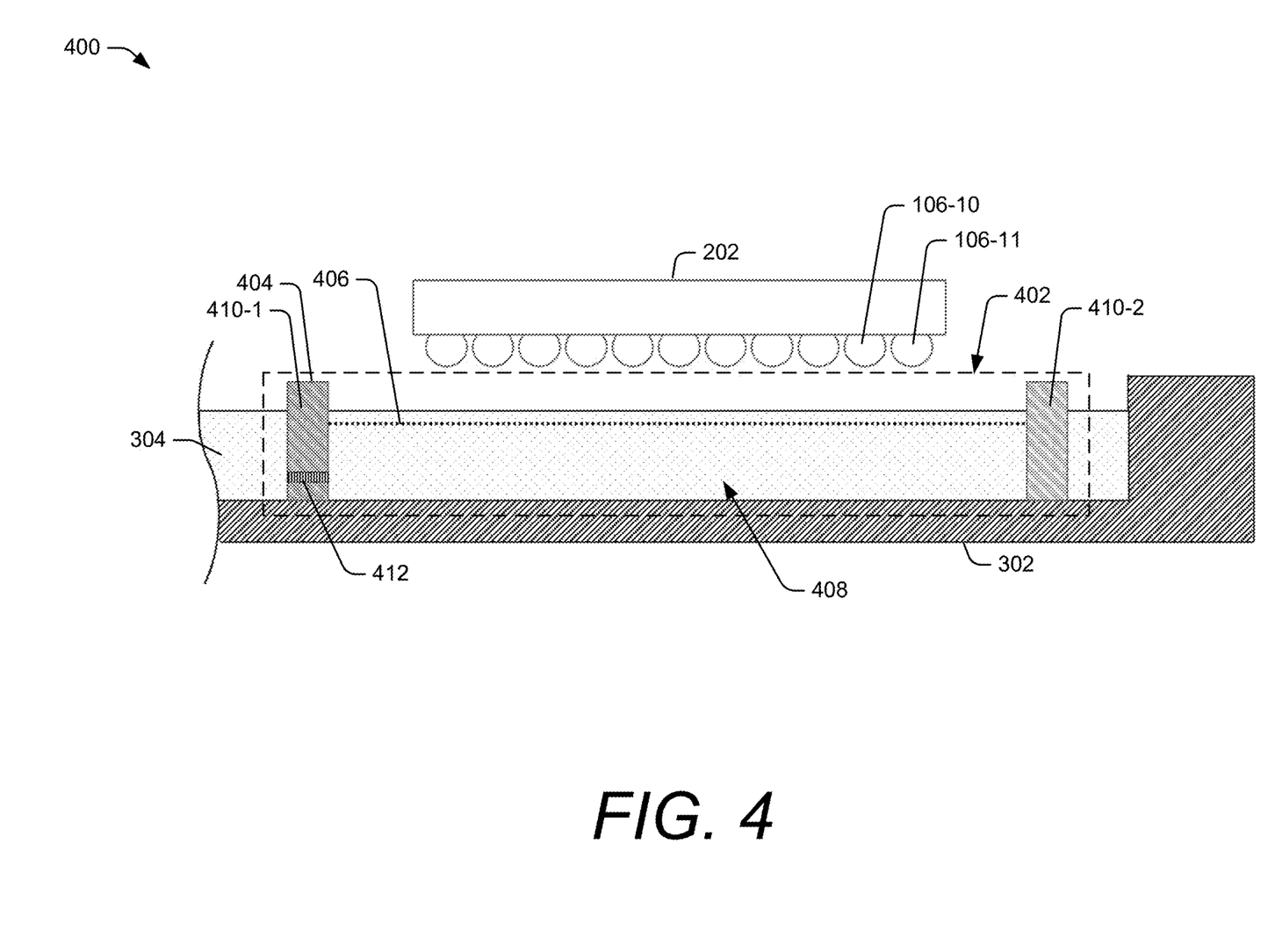
FIG. 4 illustrates an example environment 400 depicting a side view of the BGA dipping process prior to immersion of the solder balls.

FIG. 4 illustrates an example environment 400 depicting a side view of the BGA dipping process prior to immersion of the solder balls 106 (e.g., solder ball 106-10, solder ball 106-11). As illustrated, solder balls 106 of the integrated circuit component 202 are held above the reservoir 302 filled with flux 304. The flux 304 (e.g., gel solder flux, liquid solder flux, underfill flux) may be a chemical cleaning agent, flowing agent, and/or purifying agent, which may facilitate the removal of contaminants prior to soldering, as well as promote wetting (e.g., the process in which metal in the solder chemically and physically bonds with another metal) by protecting the metal surface from re-oxidation during soldering. In some implementations, the flux 304 may be an epoxy-based material developed to bond integrated circuits to printed circuit boards. The amount of flux 304 within the reservoir 302 may vary, enabling a shallower or deeper dipping of the solder balls 106.

FIG. 4 further illustrates a depth-adaptive mechanism 402, positioned in the reservoir 302, having a frame 404 and a tensioned mesh 406. The frame 404, constituting a support structure, may form any hollow three-dimensional (3D) shape, including a rectangular prism, a cone, an ovoid, a hemisphere, or a cylinder, having at least one open face, defining an internal cavity 408 and walls 410 (e.g., wall 410-1, wall 410-2). For example, as illustrated in FIG. 4, the frame 404 may have two open faces forming an annular cylinder, defining an internal cavity 408 and walls 410. In addition, the frame 404, forming a 3D shape, may possess a plurality of holes (e.g., hole 412) in one or more faces of the defined 3D shape. These holes may enable flux 304 to flow in and out of the internal cavity 408.

The tensioned mesh 406 of the depth-adaptive mechanism 402 may be secured (e.g., affixed, sealed) to walls of the frame 404 in a planar orientation that is substantially parallel to a surface of the flux. Further, the tensioned mesh 406 may be a prefabricated longitudinal and latitudinal grid containing strands of metal, fiber, plastic, or the like in a series of equally-spaced rows and columns. Further, the tensioned mesh 406 can be a variety of mesh sizes (e.g., the measurement of threads per square inch). For example, the tensioned mesh 406 size may be 100 micron. The tensioned mesh 406 may also possess a variety of elastic modulus values (e.g., measurement of elasticity in pascals (Pa)). The various elastic modulus values of the tensioned mesh may enable varying elastic deformation responses, including stiffness and spring back.

The tensioned mesh 406 of the depth-adaptive mechanism 402 can be configured to different heights. For example, as illustrated in FIG. 4, the tensioned mesh 406 may be configured to be at a height such that the tensioned mesh 406 is just below the surface of the flux 304. In other implementations, the tensioned mesh 406 can be configured such that the tensioned mesh 406 is tens or hundreds of millimeters or micrometers below the surface of the flux 304.

Further to the above descriptions, the depth-adaptive mechanism 402 may be a variety of sizes. For example, the frame 404 of depth-adaptive mechanism 402 as illustrated in FIG. 4, may protrude out above the surface of the flux 304. In other implementations, the height of the depth-adaptive mechanism 402 may be substantially small enough such that the frame 404 and tensioned mesh 406 are completely submerged in the flux 304. Further, the width of the depth-adaptive mechanism 402 may vary, inducing various tensile magnitudes of the tensioned mesh 406.

In addition, the depth-adaptive mechanism 402 may be a separate component, positionable at various locations within the reservoir 302. In other implementations, the depth-adaptive mechanism 402, or individual components of the depth-adaptive mechanism 402, including the tensioned mesh 406, may be integrated directly into the structure of the reservoir 302, or affixed thereto. In other implementations, more than one depth-adaptive mechanism 402 may be positioned in a reservoir 302.

Figure 5:
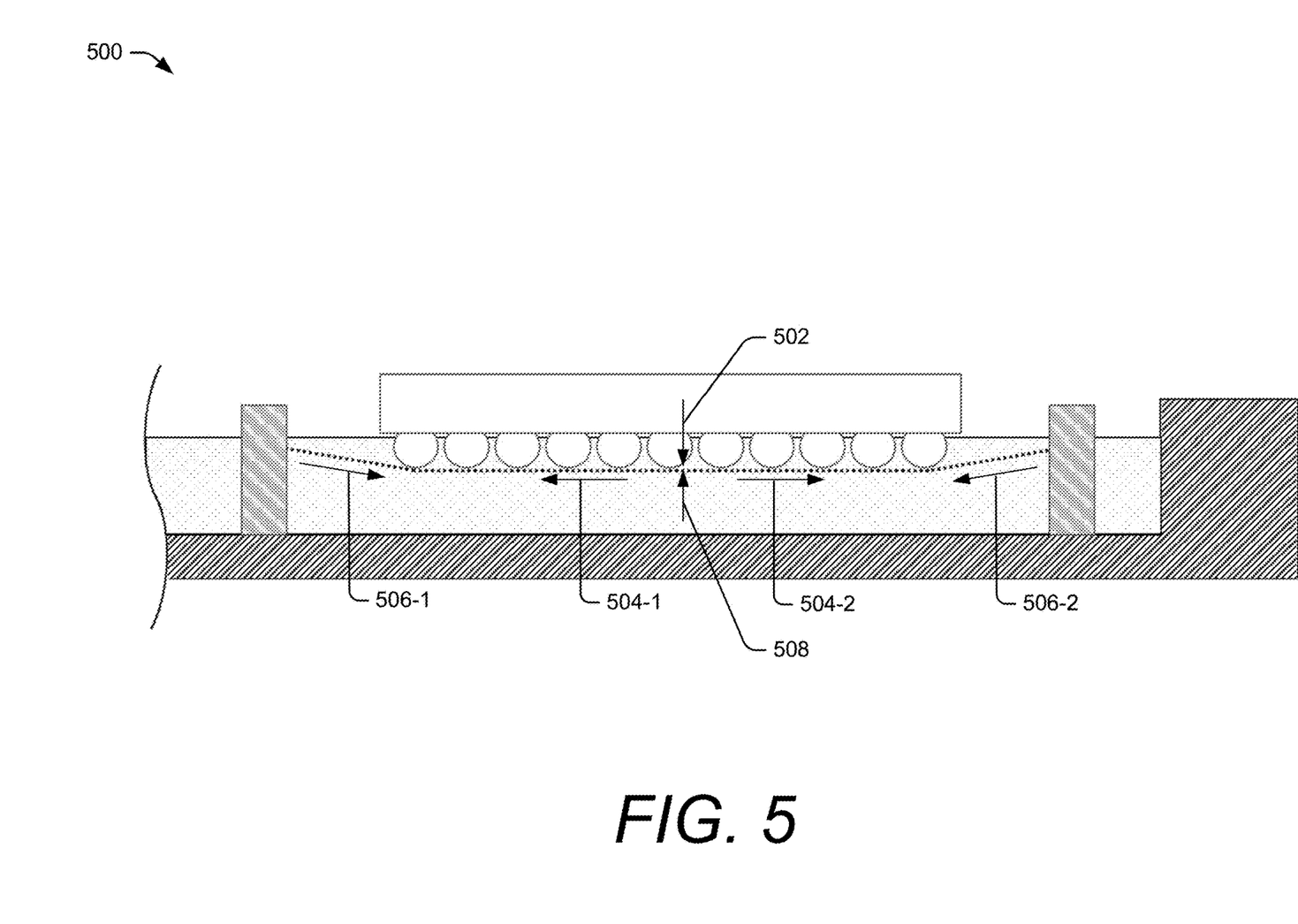
FIG. 5 illustrates a diagrammatic representation of the forces acting on a depth-adaptive mechanism during BGA dipping and immersion of solder balls.

FIG. 5 illustrates a diagrammatic representation of the forces acting on a depth-adaptive mechanism (e.g., depth-adaptive mechanism 402) during BGA dipping and immersion of solder balls (e.g., solder balls 106). As illustrated in FIG. 5, solder balls are submerged in flux (e.g., flux 204). The solder balls press up against a tensioned mesh (e.g., tensioned mesh 406) resulting in a force directed downward ("pushing force") 502 on the tensioned mesh. The pushing force 502 applied by the solder balls of the integrated circuit component (e.g., integrated circuit component 102) on the tensioned mesh, produces a tensile force 504 (e.g., tensile force 504-1, tensile force 504-2) in the tensioned mesh according to Hooke's Law.

Hooke's Law may be quantified by equation (1) below:

$$F = -kx \qquad (1)$$

For equation (1), F represents the force (e.g., in Newtons (N)) applied to the tensioned mesh by the solder balls of an integrated circuit component, k represents the spring constant (e.g., in N per meter (N/m)) of the tensioned mesh, and x represents the distance from the equilibrium position of the tensioned mesh (e.g., in meters (m)).

The tensile force 504 induces an elastic restorative force 506 (e.g., 506-1, 506-2) in the tensioned mesh. The elastic restorative force 506 produces a reaction force 508 according to Newton's Third Law of Motion. More specifically, there is an equal and opposite reaction force 508 to the pushing force 502.

As a result, when extracting the solder balls from the flux, the reaction force 508 provided by the tension mesh may facilitate the extraction of solder balls. In so doing, during BGA dipping, even at deeper dipping depths, the reaction force 508 provided by the tension mesh can prevent solder balls of an integrated circuit component from getting stuck in flux. The depth-adaptive mechanism may therefore promote BGA dipping efficiency.

After the solder balls have been dipped into and extracted from the flux, with the assistance of the depth-adaptive mechanism, the integrated circuit component can be mounted to an external circuit (e.g., PCB 104).

Figure 6:
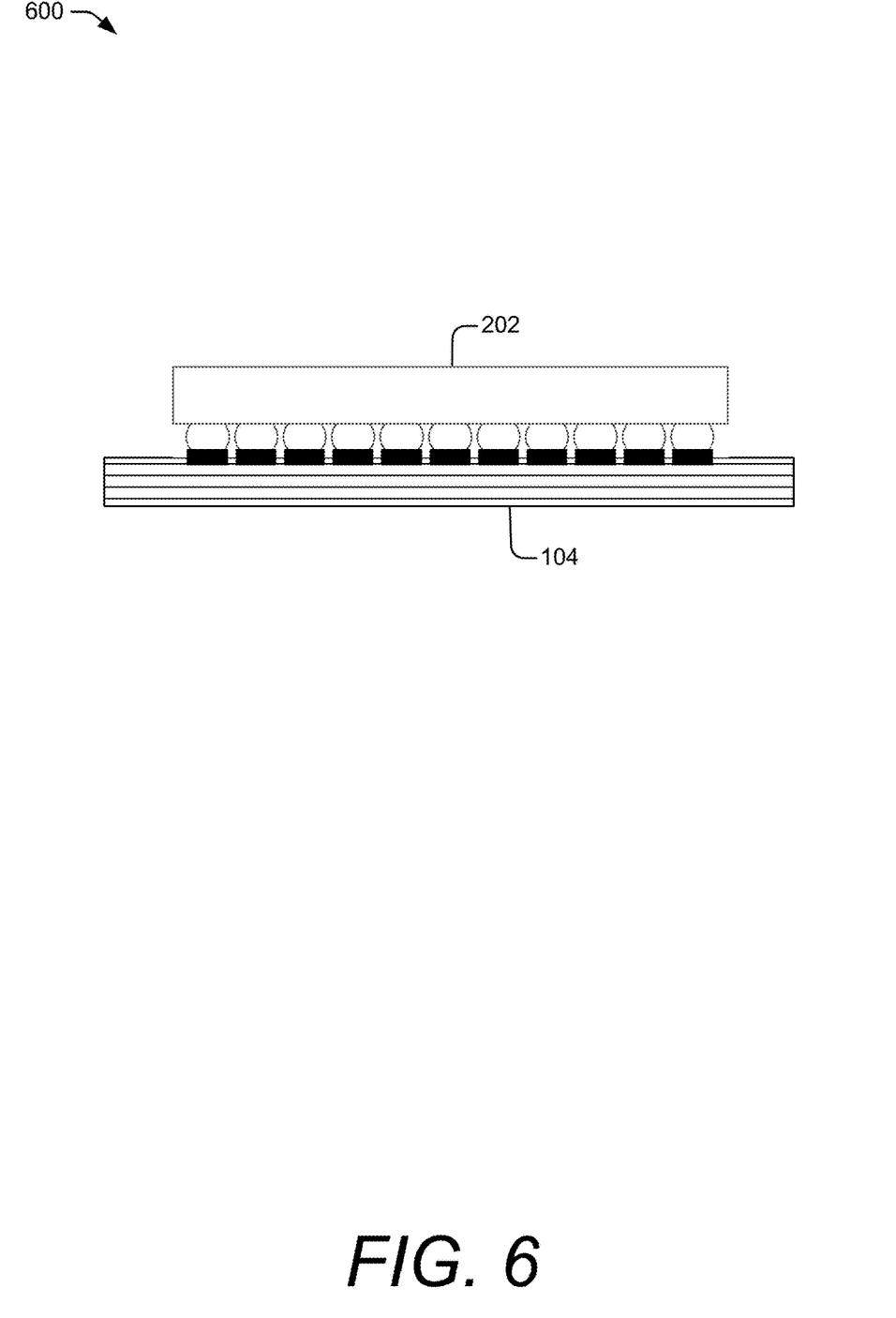
FIG. 6 illustrates an example environment in which an integrated circuit component is mounted to an external circuit in an electronic device.

FIG. 6 illustrates an example environment 600 in which the integrated circuit component 202 is mounted (e.g., soldered) to the PCB 104 of the electronic device 102. During the mounting of the integrated circuit component 202 to the PCB 104, the solder balls may first be aligned to pads (e.g., flat conductors) of the PCB 104 and then soldered to the PCB 104 by means of reflow (e.g., melting of the solder balls using hot air). The soldering may produce a physical and an electrical coupling (e.g., solder joints 108) between the integrated circuit component 202 and the PCB 104.

Additional benefits of the disclosed systems and techniques as described herein include the utilization of multiple depth-adaptive mechanisms in a single reservoir to perform BGA dipping for integrated circuit components with various dipping depth requirements. This further enhances BGA dipping efficiency since it eliminates the need for using various reservoirs, each configured to address different BGA dipping requirements.

What is claimed is:

1. A system comprising:
a reservoir configured to store flux for dipping an array of solder balls; and
a depth-adaptive mechanism disposed within the reservoir, the depth-adaptive mechanism comprising:
a frame, constituting a support structure, having at least two walls; and
a flexible mesh material secured by the at least two walls of the frame in a planar orientation that is substantially parallel to a surface of the flux and is at a predefined distance below the surface of the flux, the flexible mesh material tensioned between the at least two portions of the support structure to provide a reaction force that reacts to a pushing force associated with the array of solder balls being pressed against the flexible mesh material.

2. The apparatus of claim 1, wherein the flexible mesh is configured, based on the tension, to provide the reaction force to lift the array of solder balls out of the flux when the pushing force is removed.

3. The apparatus of claim 1, wherein the flexible mesh is configured to prevent one or more of the solder balls from getting stuck within the flux when the pushing force is removed.

4. The apparatus of claim 1, wherein the predefined distance is adjustable to enable substantial submersion of different sizes of the solder balls while providing the reaction force sufficient to lift the solder balls out of the flux.

5. The apparatus of claim 4, wherein the predefined distance is defined based on a diameter of the solder balls in the array of solder balls.

6. The apparatus of claim 1, wherein, when the reservoir is filled with the flux, the flexible mesh material is secured under a surface of the flux by the support structure.

7. The apparatus of claim 1, wherein the reaction force of the flexible mesh material is sufficient to enable the dipping mechanism to withdraw from the flux after contacting the surface of the flux.

* * * * *